United States Patent [19]

Fujinaga et al.

[11] Patent Number: 5,293,557
[45] Date of Patent: Mar. 8, 1994

[54] METHOD OF DESCRIBING A SURFACE OF AN OBJECT AFTER PROCESSING

[75] Inventors: Masato Fujinaga; Norihiko Kotani, both of Itami, Japan

[73] Assignee: Mitsubishi Denki Kabushiki Kaisha, Tokyo, Japan

[21] Appl. No.: 685,655

[22] Filed: Apr. 16, 1991

[30] Foreign Application Priority Data

Sep. 26, 1990 [JP] Japan .................. 2-254113

[51] Int. Cl.⁵ .............................. G06F 15/60
[52] U.S. Cl. ............................ 364/578; 364/468
[58] Field of Search ............ 364/578, 468, 476, 560, 364/569, 488, 490, 512; 382/44, 1; 204/298.32; 264/225

[56] References Cited

U.S. PATENT DOCUMENTS

| T944,007 | 3/1978 | Booth, Jr. et al. | 364/468 |
|---|---|---|---|
| 4,463,380 | 7/1984 | Hooks, Jr. | 382/44 |
| 4,534,003 | 8/1985 | Manzione | 364/578 |
| 4,785,399 | 11/1988 | Evans et al. | 364/512 |
| 4,882,763 | 11/1989 | Buchan et al. | 382/1 |
| 5,031,108 | 7/1991 | Fujita et al. | 364/578 |
| 5,031,127 | 7/1991 | Fujita et al. | 364/578 |
| 5,067,101 | 11/1991 | Kunikiyo et al. | 364/578 |
| 5,070,469 | 12/1991 | Kunikiyo et al. | 364/578 |
| 5,071,597 | 12/1991 | D'Amato et al. | 264/225 |
| 5,097,432 | 3/1992 | Harada et al. | 364/578 |
| 5,111,404 | 5/1992 | Kotani | 364/468 |

OTHER PUBLICATIONS

Hirai et al, "Three Dimensional Process Simulator For Photo and Electron Beam Lithography, and Estimations of Proximity Effects", Symposium on VLSI Technology, IEEE Cat. No. 87th 0189-01, 1987, pp. 15-16.

Oldham et al, "A General Simulator for VLSI Lithography and Etching Processes: Part II-Application to Deposition and Etching", IEEE Transactions on Electron Devices, vol. ED-27, No. 8, Aug. 1980, pp. 1455-1459.

Matsuzawa et al, "A Three-Dimensional Photoresist Image Simulator: TRIPS-I", IEEE Electron Device Letters, vol. EDL-6, No. 8, Aug. 1985, pp. 416-418.

Primary Examiner—Jack B. Harvey
Assistant Examiner—Ellis B. Ramirez
Attorney, Agent, or Firm—Leydig, Voit & Mayer

[57] ABSTRACT

A shape simulation method includes dividing an analysis volume into a plurality of cells, defining an initial volume ratio of the volume of a substance in a cell to the volume of the cell for each cell, computing the in flow and the out flow of the substance in each cell every time a very small time period elapses, computing a volume ratio for each cell from the initial volume and the in flow and out flow of the substance every time a very small time period elapses, and simulating the surface shape of the substance with the cells having a volume ratio of a predetermined value.

6 Claims, 15 Drawing Sheets

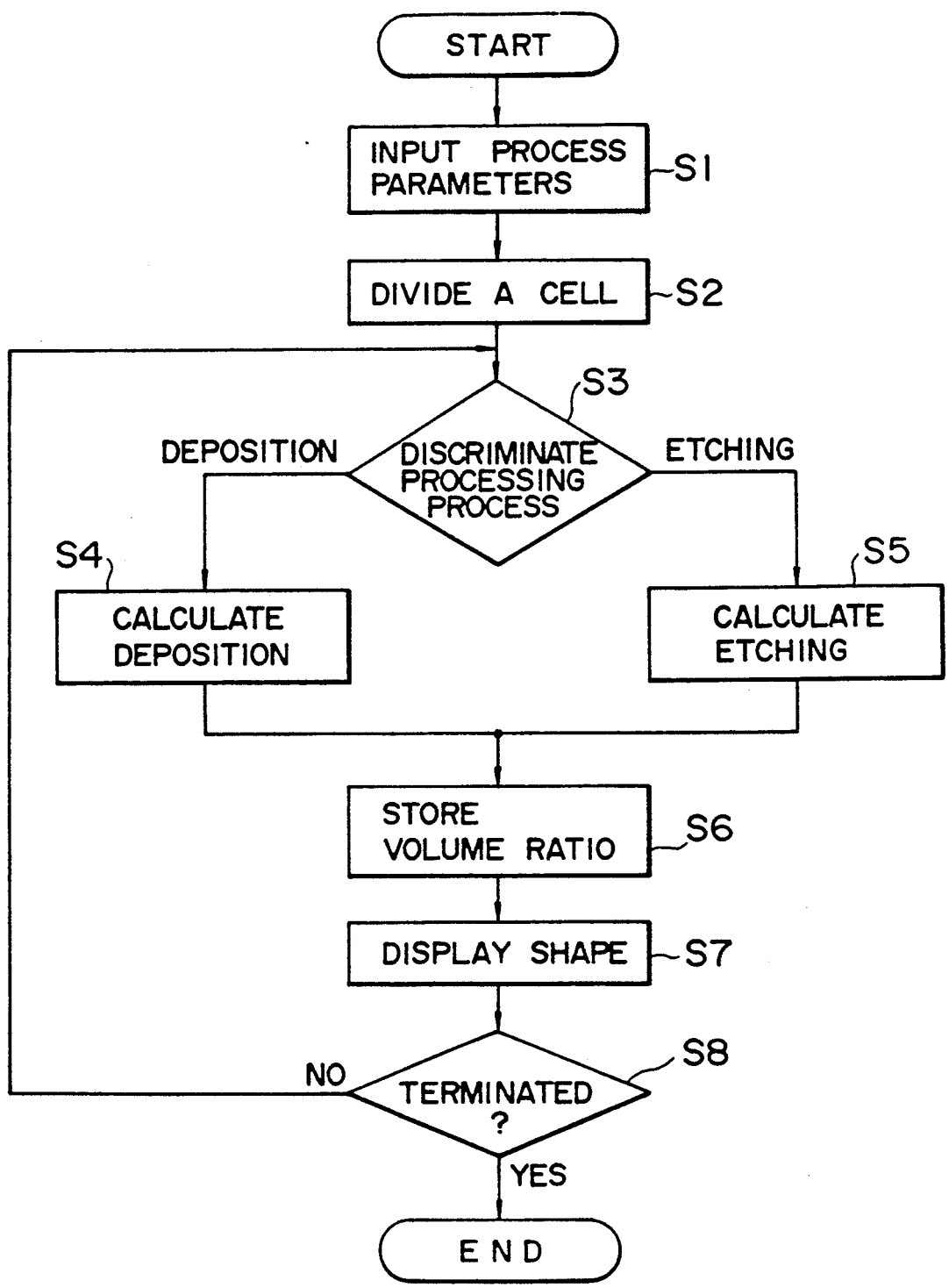

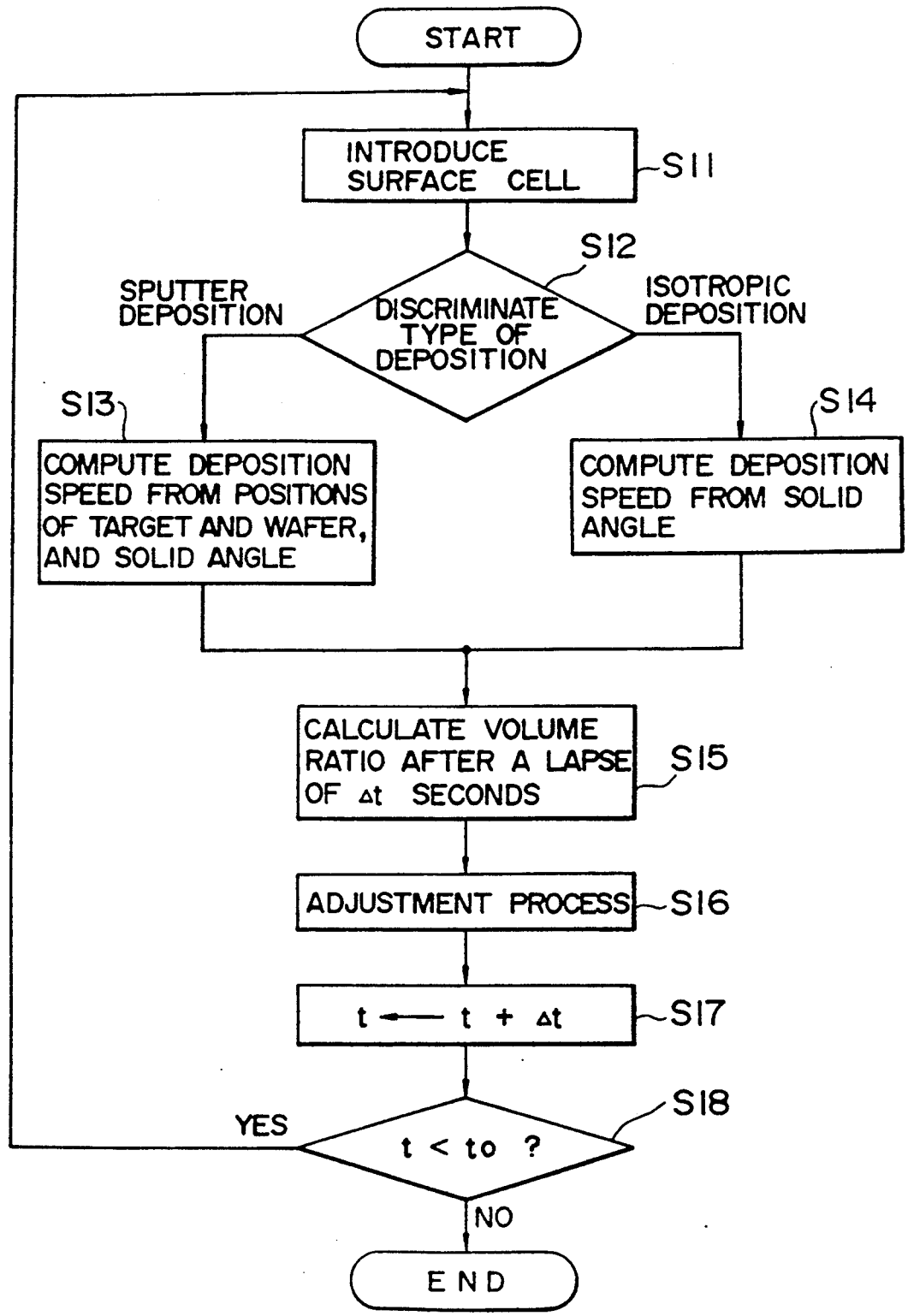

FIG. 3A

| i = | 1 | 2 | 3 | 4 | 5 |
|---|---|---|---|---|---|
| k=1 | 0 | 0 | 0 | 0 | 0 |
| 2 | 1 | 0.1 | 0 | 0 | 0 |
| 3 | 1 | 1 | 0.2 | 0 | 0 |
| 4 | 1 | 1 | 0.7 | 0 | 0 |
| 5 | 1 | 1 | 0.5 | 0 | 0 |

FIG. 3B

| i = | 1 | 2 | 3 | 4 | 5 |
|---|---|---|---|---|---|
| k=1 | 0 | 0 | 0 | 0 | 0 |
| 2 | 1.2 | 0.1 | 0 | 0 | 0 |
| 3 | 1 | 1.2 | 0.2 | 0 | 0 |
| 4 | 1 | 1 | 0.9 | 0 | 0 |
| 5 | 1 | 1 | 0.7 | 0 | 0 |

FIG. 3C

| i = | 1 | 2 | 3 | 4 | 5 |
|---|---|---|---|---|---|
| k=1 | 0.1 | 0 | 0 | 0 | 0 |
| 2 | 1 | 0.3 | 0 | 0 | 0 |
| 3 | 1 | 1 | 0.3 | 0 | 0 |
| 4 | 1 | 1 | 0.9 | 0 | 0 |
| 5 | 1 | 1 | 0.7 | 0 | 0 |

FIG. 4A

| 0 | 0 | 0 | 0 | 0 |
|---|---|---|---|---|
| 0 | 0 | 0 | 0 | 0 |
| 0 | 0 | 0 | 0 | 0 |
| 1.0 | 0.5 | 0 | 0 | 0 |
| 1.0 | 1.0 | 0.7 | 0 | 0 |

SUBSTANCE $X_1$

FIG. 4B

| 0 | 0 | 0 | 0 | 0 |
|---|---|---|---|---|
| 0 | 0 | 0.7 | 0 | 0 |
| 0 | 0.3 | 1 | 0.4 | 0 |
| 0 | 0.5 | 1 | 1 | 1 |
| 0 | 0 | 0.3 | 1 | 1 |

SUBSTANCE $X_2$

FIG. 4C

| 1.0 | 0.8 | 0 | 0 | 0 |
|---|---|---|---|---|
| 1.0 | 1.0 | 0.3 | 0 | 0 |
| 1.0 | 0.7 | 0 | 0 | 0 |
| 0 | 0 | 0 | 0 | 0 |
| 0 | 0 | 0 | 0 | 0 |

SUBSTANCE $X_3$

FIG. 4D

| 1 | 0.8 | 0 | 0 | 0 |
|---|---|---|---|---|
| 1 | 1 | 1 | 0 | 0 |
| 1 | 1 | 1 | 0.4 | 0 |
| 1 | 1 | 1 | 1 | 1 |
| 1 | 1 | 1 | 1 | 1 |

ALL SUBSTANCES

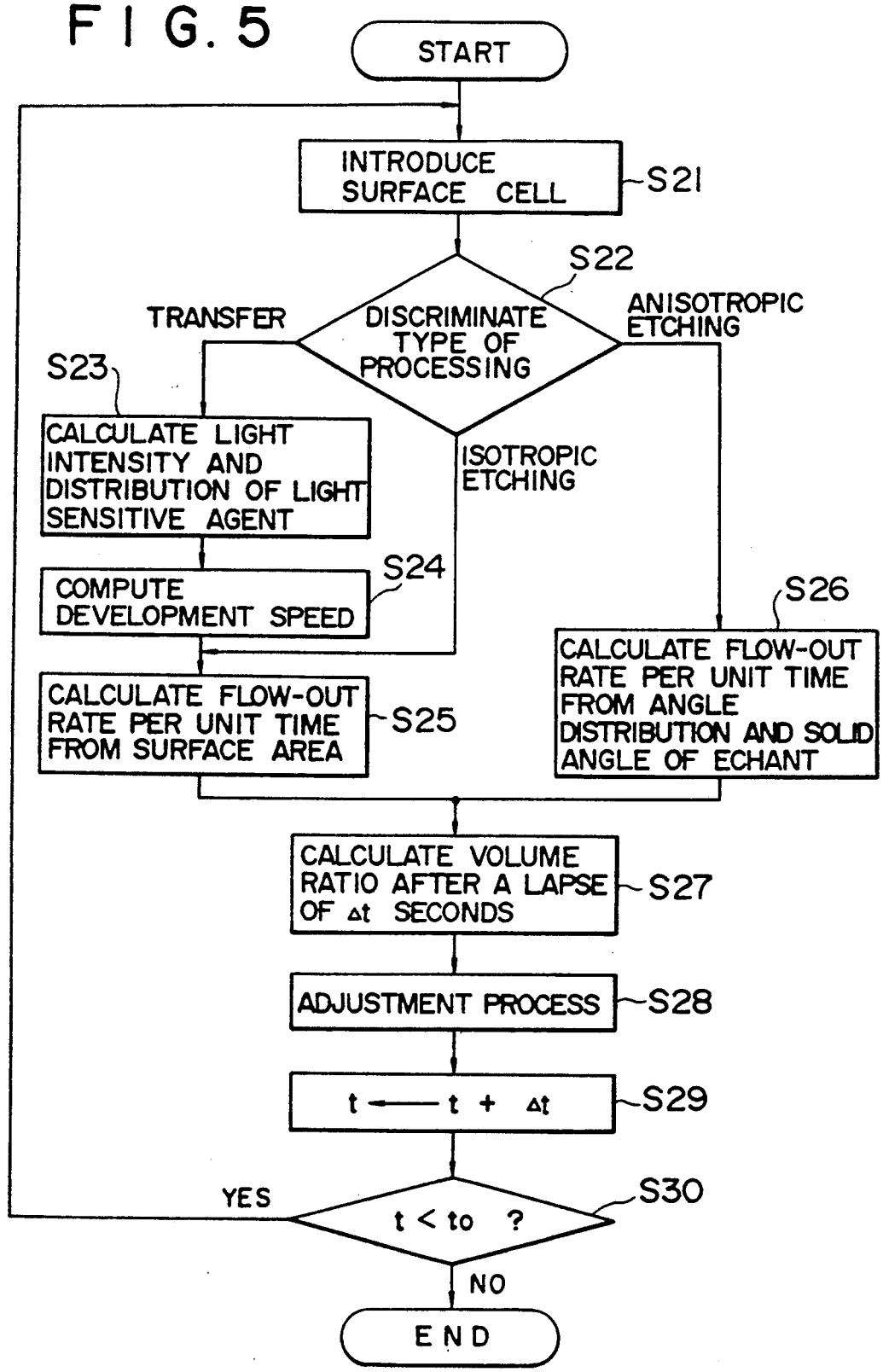

FIG. 6A

|  | i = 1 | 2 | 3 | 4 | 5 |
|---|---|---|---|---|---|
| k=1 | 0 | 0 | 0 | 0 | 0 |
| 2 | 1 | 0.1 | 0 | 0 | 0 |
| 3 | 1 | 1 | 0.2 | 0 | 0 |
| 4 | 1 | 1 | 0.7 | 0 | 0 |
| 5 | 1 | 1 | 0.5 | 0 | 0 |

FIG. 6B

|  | i = 1 | 2 | 3 | 4 | 5 |
|---|---|---|---|---|---|
| k=1 | 0 | 0 | 0 | 0 | 0 |
| 2 | 0.9 | 0.1 | 0 | 0 | 0 |
| 3 | 1 | 1 | 0 | 0 | 0 |
| 4 | 1 | 1 | 0.6 | 0 | 0 |
| 5 | 1 | 1 | 0.4 | 0 | 0 |

FIG. 6C

|  | i = 1 | 2 | 3 | 4 | 5 |
|---|---|---|---|---|---|
| k=1 | 0 | 0 | 0 | 0 | 0 |
| 2 | 0.85 | 0 | 0 | 0 | 0 |
| 3 | 1 | 0.95 | 0 | 0 | 0 |
| 4 | 1 | 1 | 0.6 | 0 | 0 |
| 5 | 1 | 1 | 0.4 | 0 | 0 |

CELL (i, j, k)

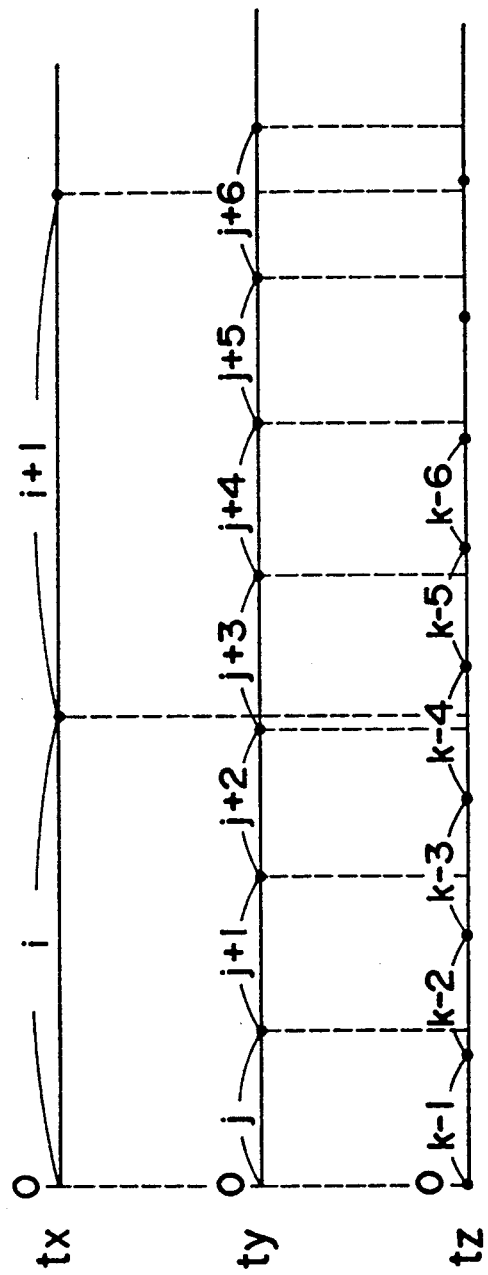

METHOD OF DESCRIBING A SURFACE OF AN OBJECT AFTER PROCESSING

BACKGROUND OF THE INVENTION

Field of the Invention

The present invention relates to a shape simulation method and, in particular, to a method of simulating the fabrication shapes of semiconductor devices such as LSIs.

Description of the Related Art

FIGS. 11A to 11C are conceptual figures of conventional shape representation models which are disclosed in "Line-Profile Resist Development Simulation Techniques", R. E. JEWETT et al, Polymer Engineering and Science, June 1977, Vol. 17, No. 6, pp. 381-384. FIGS. 11A to 11C show, respectively, a string model, a cell removal model, and a ray tracing model.

In the string model of FIG. 11A, the shape of a substance is represented by using short string segments 112 connected by string points 111. Each string segment 112 is moved every very small time period and changes over time as the shape of the substance changes. Generally, each string segment 112 is moved so that the string points 111 move in the direction of the bisector of the angle formed by two adjacent string segments 112.

In the cell removal model of FIG. 11B, the shape of a substance is represented by small rectangular parallelepiped cells 113. The changes over time in the shape of the substance are represented by adding or deleting cells 113. In this model, the shape of the substance up to the time a previous process has been completed can be stored simply and easily by storing a cell 113 of (i,j,k) with an index of any one out of 0 (vacuum), 1 (silicon), or 2 (oxide).

In the ray tracing model of FIG. 11C, in a manner similar to that used in the string model, the shape of a substance is recorded by using short string segments 115 which are connected to each other by string points 114. The string points 114 move in the direction in which a light beam travels.

However, in the string model and the ray tracing model, if too long a string segment 121 shown in FIG. 12A occurs, since singular point processing must be performed every time a very small time period elapses, the string segment 121 must be divided into two string segments 122 and 123, as shown in FIG. 12B. Or, if too short a string segment 124 shown in FIG. 12C or a loop 125 shown in FIG. 12E occurs, since singular point processing must be performed every time a very small time period elapses, the string segment 124 or the loop 125 must be deleted, as shown respectively in FIGS. 12D and 12F. This processing poses a problem in that it becomes very complex when a three-dimensional shape is calculated and the calculation process takes a long period of time. Also, in these models, since a one-dimensional approximation is used, it is extremely difficult to accurately simulate etching or deposition in which the amount of the grains varies.

In addition, in the string model and the ray tracing model, a problem exists in that the method of storing shapes is difficult to perform. For example, as shown in FIG. 13A, in the case where an oxide 133 is accumulated in a recess 132 of silicon 131, when the string segments 134 and 135 on the surface of the oxide 133 intersect each other, as shown in FIG. 13B, and if a loop 136 formed by the above intersection is deleted by the above-described singular point processing, as shown in FIG. 13C, a required string segment may be deleted and the shape becomes very different from the actual shape.

Meanwhile, in the cell removal model, the shape takes the form of a staircase because there are no slanted surfaces. In particular, in order to simulate a three-dimensional shape with high precision, a vast number of cells are required, thereby posing a problem in that the calculation time is increased.

SUMMARY OF THE INVENTION

The present invention has been devised to solve the above-mentioned problems. An object of the present invention is to provide a shape simulation method for simulating a three-dimensional shape with high precision and at high speed.

The shape simulation method of the present invention comprises the steps of: dividing an analysis volume into a plurality of cells, defining an initial volume ratio of the volume of a substance in a cell to the volume of the cell for each cell computing the in flow and the out flow of the substance in each cell every time a very small time period elapses; computing a volume ratio for each cell from the initial volume ratio and the in flow and out flow every time a very small time period elapses, and simulating the surface shape with the cells having a volume ratio of a predetermined value.

BRIEF DESCRIPTION OF THE DRAWINGS

FIG. 1 is a flowchart showing a shape simulation method according to an embodiment of the present invention;

FIG. 2 is a flowchart showing the flow of a deposition calculation;

FIGS. 3A to 3C are views showing an example in which the volume ratio of a substance is concretely calculated according to the flowchart of FIG. 2;

FIGS. 4A and 4D are views showing the relationships of volume ratios when a plurality of substances are mixed in an analysis area;

FIG. 5 is a flowchart showing the flow of an etching calculation;

FIG. 6A through 6C is a view showing examples in which the volume ratio of the substance is concretely calculated according to the flowchart of FIG. 5;

DESCRIPTION OF THE PREFERRED EMBODIMENT

Figures 7A, 7B:
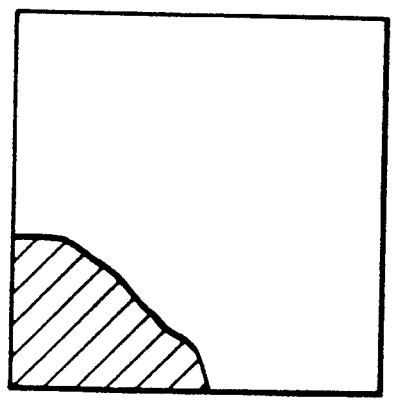
FIGS. 7A and 7B are, respectively, a view showing the volume ratio of each cell and a view showing the shape of the substance represented on the basis of data of FIG. 7A.

An embodiment of the present invention will be explained hereinunder with reference to the accompanying drawings.

In the flowchart of FIG. 1, first, process parameters are input in step S1. Next, in step S2, an analysis area is divided into a plurality of rectangular parallelepiped cells. If the cell number in the x direction is i, in the y direction j, and in the z direction k, then each cell is denoted as (i,j,k).

In the next step S3, a processing process is determined. If the process is a deposition process, the process proceeds to step S4 where deposition calculation is performed. If the process is an etching process, the process proceeds to step S5 where etching calculation is performed. In the steps S4 and S5, the volume ratio of the substance of each cell is computed when the deposition process or the etching process has been completed. Thereafter, the volume ratio in each cell is stored in step S6, and in step S7, the shape of the substance is displayed by an equal volume ratio face having a volume ratio of a predetermined value. Steps S3 through S7 are repeatedly performed until it is determined in step S8 that a series of processes are terminated completely.

A flowchart of the deposition calculation in step S4 is shown in FIG. 2. The method of the deposition calculation is explained in detail hereinunder with reference to FIG. 2. FIG. 3A shows the state before the deposition process in the x-z two-dimensional cross section, in which the analysis area is divided into a plurality of rectangular parallelepiped cells (i,j,k). The number in each cell indicates the volume ratio $C^t(i,j,k)$ of the substance present in that cell. First, the surface cells are introduced in step S11 of FIG. 2. The volume ratios $C^t(i\pm1,j,k)$, $C^t(i,j\pm1,k)$, and $C^t(i,j,k\pm1)$ of the cells adjacent to a cell (i,j,k) are considered and, when there exists a cell whose volume ratio is less than 1.0 and at least 0.5, that cell is regarded as a surface cell. In FIG. 3A, cells in the shaded portions are surface cells.

Next, in step S12, the type of the deposition is discriminated. If the deposition is a sputter deposition, a deposition speed is computed in step S13 from the positional relationship between a target and a wafer, and a solid angle. If the deposition is an isotropic deposition, a deposition speed is computed from the solid angle in step S14. A volume ratio $R_{ijk}$, at which a substance X to be accumulated flows into a surface cell (i,j,k), is determined on the basis of the deposition speed.

Further, the volume ratio $C^{t+\Delta t}(i,j,k)$ of all substances of the cells (i,j,k) after a lapse of a very small time period $\Delta t$ seconds is calculated on the basis of the next equation in step S15.

$$C^{t+\Delta t}(i,j,k) = C^t(i,j,k) + R_{ijk}\cdot\Delta t$$

The volume ratio of each cell after a lapse of a very small time period $\Delta t$ seconds is shown in FIG. 3B.

Likewise, the volume ratio $C_x^{t+\Delta t}(i,j,k)$ of only the substance X of the cell (i,j,k) after a lapse of a very small time period $\Delta t$ seconds is expressed as:

$$C_x^{t+\Delta t}(i,j,k) = C_x^t(i,j,k) + R_{ijk}\cdot\Delta t.$$

Thereafter, in step S16, an adjustment of the volume ratio of each cell is performed. That is, when the volume ratios of all substances exceed 1 as for cells (i=1,k=2) and (i=2,k=3) with circle marks in FIG. 3B, if cells whose volume ratio is less than 0.5 from among the cells $(i\pm1,j,k)$, $(i,j\pm1,k)$, and $(i,j,k\pm1)$ around that cell (i,j,k) are denoted as $\alpha, \beta, \gamma, \ldots$ and the areas with which the cell (i,j,k) is in contact are denoted as $S_\alpha, S_\beta, S_\gamma, \ldots$, the following formulas apply:

$$C^{t+\Delta t}(i,j,k) \leftarrow 1$$

$$C^{t+\Delta t}(\alpha) \leftarrow C^{t+\Delta t}(\alpha) + \eta S_\alpha/(S_{60}+S_\beta+S_\gamma+\ldots)$$

$$C^{t+\Delta t}(\beta) \leftarrow C^{t+\Delta t}(\beta) + \eta S_\beta/(S_\alpha+S_\beta+S_\gamma+\ldots)$$

$$C^{t+\Delta t}(\gamma) \leftarrow C^{t+\Delta t}(\gamma) + \eta S_\gamma/(S_\alpha+S_\beta+S_\gamma+\ldots)$$

where $\eta = C^{t+\Delta t}(i,j,k) - 1$.

Likewise, for the substance X, the following formulas apply:

$$C_x^{t+\Delta t}(i,j,k) \leftarrow C_x^{t+\Delta t}(i,j,k) - \eta$$

$$C_x^{t+\Delta t}(\alpha) \leftarrow C_x^{t+\Delta t}(\alpha) + \eta S_\alpha/(S_\alpha+S_\beta+S_\gamma+\ldots)$$

$$C_x^{t+\Delta t}(\beta) \leftarrow C_x^{t+\Delta t}(\beta) + \eta S_\beta/(S_\alpha+S_\beta+S_\gamma+\ldots)$$

$$C_x^{t+\Delta t}(\gamma) \leftarrow C_x^{t+\Delta t}(\gamma) + \eta S_\gamma/(S_\alpha+S_\beta+S_\gamma+\ldots).$$

If the above adjustment is performed, the volume ratios of all substances become as shown in FIG. 3C. The series of above steps S11 through S16 is performed every time a very small time period $\Delta t$ elapses until it is determined in step S18 that the total deposition time $t_0$ has elapsed.

For example, if three substances $X_1$, $X_2$, and $X_3$ are present in a mixture in the analysis area, a value obtained by adding the volume ratios $C_{x1}(i,j,k)$, $C_{x2}(i,j,k)$, and $C_{x3}(i,j,k)$ in respective cells (i,j,k) of substances $X_1$, $X_2$, and $X_3$, shown respectively in FIGS. 4A to 4C, becomes the volume ratio $C(i,j,k)$ of all the substances shown in FIG. 4D.

A flowchart of the etching calculation in step S5 of FIG. 1 is shown in FIG. 5. The method of the etching calculation will be explained in detail hereinunder with reference to FIG. 5. FIG. 6A shows the state before the etching process in the x-z two-dimensional cross section, in which the analysis area is divided into a plurality of rectangular parallelepiped cells (i,j,k). First, surface cells are introduced in step S21 of FIG. 5. When the volume ratio $C^{t\Delta t}(i,j,k)$ of a cell (i,j,k) is greater than 0, and when there exists a volume ratio of 0 among the volume ratios $C^t(i\pm1,j,k)$, $C^t(i,j\pm1,k)$, and $C^t(i,j,k\pm1)$ of cells around the cell (i,j,k), that cell is regarded as the surface cell. In FIG. 6A, cells in the shaded portions are surface cells.

Next, the type of processing is determined in step S22. If the processing is transferring, e.g., photoresist mask formation, light intensity and the distribution of a light sensitizing agent are calculated in step S23. After development speed is computed in the next step S24, the flow-out rate per unit time is calculated on the basis of the surface area in step S25. If isotropic etching is performed, the process proceeds directly to step S25 from step S22, in which step S25 the flow-out rate is calculated. If anisotropic etching is performed, the flow-out rate per unit time is calculated on the basis of the angle distribution and the solid angle of an etchant in step S26. A volume ratio $R_{ijk}$, at which a substance X to be etched flows out from this cell per unit time through the surface of the surface cell (i,j,k), is determined on the basis of the flow-out rate calculated in step S25 or S26.

Furthermore, the $C_x^{t+\Delta t}(i,j,k)$ of the substance X of a cell (i,j,k) after the lapse of a very small time period $\Delta t$ seconds is calculated on the basis of the following equation in step S27.

$$C_x^{t+\Delta t}(i,j,k) = C_x^t(i,j,k) - R_{ijk}\cdot\Delta t$$

The volume ratio of each cell after a lapse of $\Delta t$ seconds is shown in FIG. 6B.

Thereafter, in step S28, an adjustment of the volume ratio of each cell is performed. That is, when $C_x^{t+\Delta t}(i,j,k) < 0$ as for a cell (i=2,k=2) with circle marks in FIG. 6B, if cells whose volume ratio is 0.5 or more among the cells $(i\pm 1,j,k)$, $(i,j\pm 1,k)$, and $(i,j,k\pm 1)$ around that cell (i,j,k) are denoted as $\alpha, \beta, \gamma, \ldots$ and the areas in which the cell (i,j,k) is in contact with are denoted as $S_\alpha, S_\beta, S_\gamma, \ldots$, the following formulas apply:

$$C_x^{t+\Delta t}(i,j,k) \leftarrow 0$$

$$C_x^{t+\Delta t}(\alpha) \leftarrow C_x^{t+\Delta t}(\alpha) - \eta S_\alpha/(S_\alpha + S_\beta + S_\gamma + \ldots)$$

$$C_x^{t+\Delta t}(\beta) \leftarrow C_x^{t+\Delta t}(\beta) - \eta S_\beta/(S_\alpha + S_\beta + S_\gamma + \ldots)$$

$$C_x^{t+\Delta t}(\gamma) \leftarrow C_x^{t+\Delta t}(\gamma) - \eta S_\gamma/(S_\alpha + S_\beta + S_\gamma + \ldots)$$

where $\eta = -C_x^{t+\Delta t}(i,j,k) > 0$. If the volume ratio of cells $\alpha, \beta, \gamma, \ldots$ is negative by the above equations, the volume ratio of that cell is taken to be zero. When such adjustment is performed, the volume ratios of all the substances become as shown in FIG. 6C.

If a plurality of substances $X_1, X_2, X_3 \ldots$ are present in a mixture in the analysis area, the above processing is performed for each substance. A value obtained by adding the volume ratios $C_{x1}(i,j,k)$, $C_{x2}(i,j,k)$, and $C_{x3}(i,j,k)$ in respective substances $X_1, X_2, X_3 \ldots$ in the cell (i,j,k) is taken to be the volume ratio $C^{t+\Delta t}(i,j,k)$ of all the substances.

The series of above steps S21 through S28 is performed every very small time period $\Delta t$ until it is determined in steps S29 and S30 that a total etching time $t_0$ has elapsed.

The very small time period $\Delta t$ in the deposition calculation and the etching calculation described above should preferably be $\Delta t = \frac{1}{2} \cdot R_{max}$, where the maximum value of the volume ratio $R_{ijk}$ at which the substance flows in or flows out per unit time is denoted as $R_{max}$. However, the time interval $\Delta t_{end}$ of the last time step of the deposition time or the etching time should be:

$$\Delta t_{end} = t_0 - n\cdot\Delta t.$$

When the volume ratio after the deposition process or the etching process is computed in the above way and stored in an unillustrated file in step S6 of FIG. 1, the shape of the substance is displayed in the next step S7 on the basis of the volume ratio. At this time, the volume ratio C(i,j,k) in each cell is approximated by linear interpolation. The shape of the substance is represented, for example, by an equal volume ratio face of C(i,j,k)=0.5. An example of the shape representation is shown in FIGS. 7A and 7B. The volume ratio of each cell shown in FIG. 7A is approximated using interpolation and a surface having a volume ratio of 0.5 is shown, with the result that the shape of the substance shown in FIG. 7B is obtained.

Figure 8A:
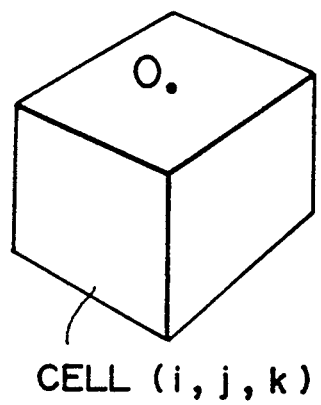
FIGS. 8A and 8F are views showing a method of calculating a solid angle.
Figure 8B:
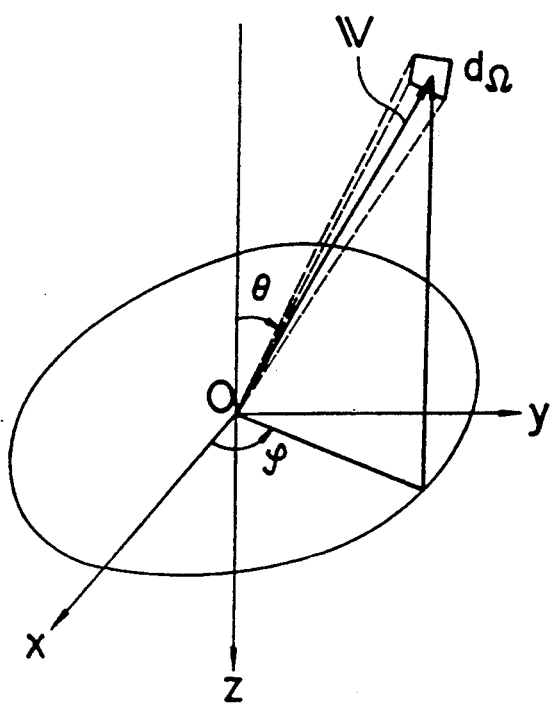

Next, an example of the method of calculating a solid angle used in steps S13 and S14 of FIG. 2, and step S26 of FIG. 5 will be explained below. First, the cell (i,j,k) has six faces. The quantity of a substance that enters each face, i.e., the number of particles, must be calculated. When the number of particles that enter one face of a cell is calculated, as shown in FIGS. 8A and 8B, a vector $V = (V_x, V_y, V_z)$ with the center point 0 of the face as a starting point is determined, where $$V_x = \sin\theta\cdot\cos\phi$$

$$V_y = \sin\theta\cdot\sin\phi$$

$$V_x = -\cos\phi$$

$$0 \leq \theta \leq \pi/2$$

$$0 \leq \phi \leq 2\pi.$$

At this time, a very small solid angle $\Delta\Omega$ is given by:

$$\Delta\Omega = \sin\theta d\phi d\theta.$$

If the divisors in the $\theta$ direction and in the $\phi$ direction are denoted as $N_\theta$ and $N_\phi$, respectively, then:

$$\theta = \pi(I - \frac{1}{2})/2N_\theta$$

$$\phi = 2\pi(J - \frac{1}{2})/N_\phi$$

where $1 \leq I \leq N_\theta$ and $1 \leq J \leq N_\phi$.

When this vector V passes through the other cells filled with a substance, particles cannot enter in that direction. One of methods requiring a relatively short calculation time to determine which cells the vector V passes through will be described below.

Figure 8C:
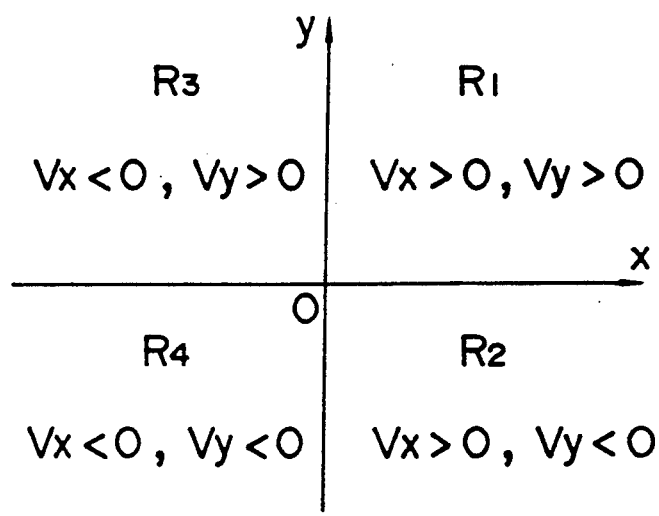

First, as shown in FIG. 8C, the xy plane is divided into four areas $R_1$ to $R_4$, and it is determined in which areas cells through which the vector V passes exist. Here, a case where a cell exists in the area $R_1$ will be explained. That is, since $V_x > 0$, $V_y > 0$, and $V_z > 0$, if a cell through which the vector V passes next to the cell (i,j,k) is denoted by (u,v,w), the following relation holds:

$$u \leq i, \ v \leq j, \ \text{and} \ w \leq k.$$

Further, if the starting point for particles is denoted as $r_0 = (x_0, y_0, z_0)$ and the vector V is regarded as the speed of the particles, the position $r = (x,y,z)$ of the particles after a lapse of t seconds is given by:

$$r = V\cdot t + r_0$$

$$x = V_x\cdot t + x_0$$

$$y = V_y\cdot t + y_0$$

$$z = V_z\cdot t + z_0.$$

Figure 8D:
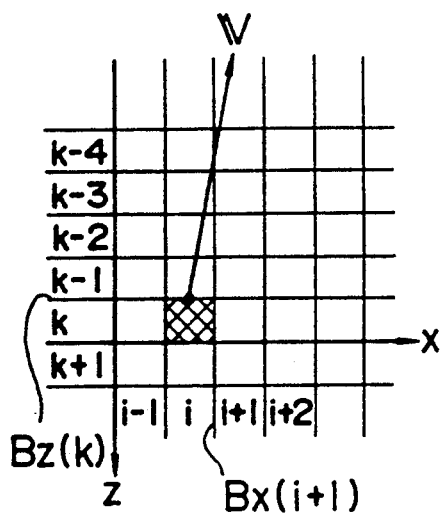
Figure 8E:
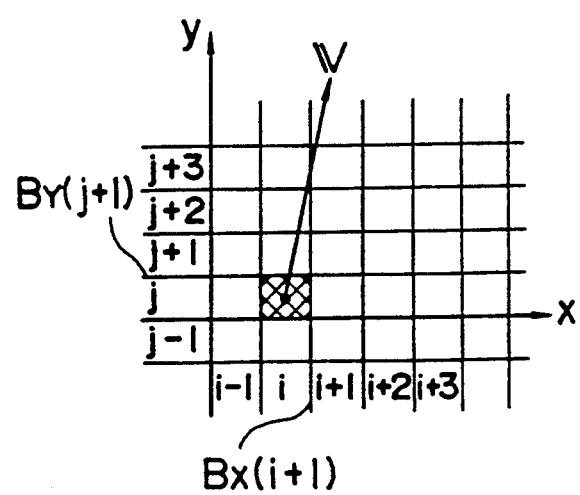

If the coordinates of the boundary of the neighboring cells are denoted as BX(i), BY(j), and BZ(k), as shown in FIGS. 8D and 8E, the times at which the particles pass through the boundary BX(i+1), BY(j+1), and BZ(k) of the cell (i,j,k) are respectively expressed as:

$$t_x(i+1) = [BX(i+1) - x_0]/V_x$$

$$t_y(j+1) = [BY(j+1) - y_0]/V_y$$

$$t_z(k) = [BZ(k) - z_0]/V_z.$$

In the example shown in FIGS. 8D and 8E, since $t_x(k)<t_y(j+1)<t_x(i+1)$, the cell number in the x direction at time t during $0<t<t_x(i+1)$ is i, and the cell number in the y direction at time t during $0<t<t_y(j+1)$ is j. Thus, the cell boundary coordinate in the z direction is moved $BZ(k-1)$, $BZ(k-2)$, ... until time t reaches $t_y(j+1)$. If the time t exceeds $t_y(j+1)$, the cell boundary coordinates in the y direction are moved one at this time, and $t_x(i+1)$ is compared with $t_y(j+2)$.

If times $t_x$, $t_y$, and $t_z$ at which vector V passes through the boundary of each cell are shown as straight lines, they are as shown in FIG. 8F. From this FIG. 8F, it can be seen that, regarding cells through which vector V passes, cell numbers in the x, y, and z directions which are reached at the same time can be written out, as $(i,j,k-1)$, $(i,j,k-2)$, $(i,j+1,k-2)$, $(i,j+1,k-3)$, $(i,j+2,k-3)$, $(i,j+2,k-4)$, $(i,j+3,k-4)$, $(i+1,j+3,k-4)$, $(i+1,j+3,k-5)$, ... In this case, however, it is preferable that first $t_z$ be moved, next $t_y$, and then $t_x$, and that cell numbers reached at the same time be checked by taking the magnitude of each cycle of $t_x$, $t_y$, and $t_z$ into consideration.

A cell at the topmost position, i.e., a cell whose z-axis coordinate is smallest, is determined from among cells filled with a substance. Cells above this cell (in the direction of the −z axis) are not taken into consideration when the determination of the solid angle is made. As a result, the calculation time is further shortened.

FIGS. 9A to 9E show examples of a shape simulation of continuous processes according to the present invention. In the examples of this simulation, contact holes and aluminum layers are formed by continuously performing ① development of a resist, ② isotropic etching, ③ anisotropic etching, ④ removal of resist, and ⑤ sputter deposition.

① Development of Resist

Figure 9A:
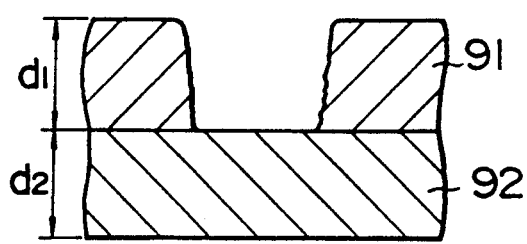
FIGS. 9A to 9E are views showing an example of shape simulation of continuous processes per formed in accordance with the present invention.

In FIG. 9A, the light intensity distribution on the surface of a resist 91 having a thickness of $d_1=1$ μm when a rectangular mask 1 μm square is used is calculated. Next, the concentration of the light sensitizing agent in the resist 91 is calculated. The speed of the development is computed on the basis of the concentration of the light sensitizing agent. As a result, the development speed (the etching speed) for each cell is determined. In this simulation of the resist development, light interference in the light reflected from a SiO2 substrate 92 having a thickness of $d_2=1$ μm was clearly simulated.

② Isotropic Etching

Figure 9D:
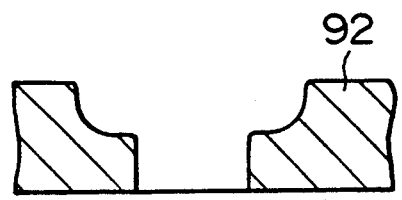
Figure 9B:
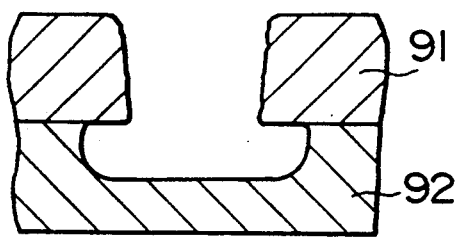

In the isotropic etching shown in FIG. 9B, it was assumed that only the SiO2 substrate 92 was etched. The amount of SiO2 that flows out from a cell on the basis of the area of the surface cell was calculated.

③ Anisotropic Etching

Figure 9E:
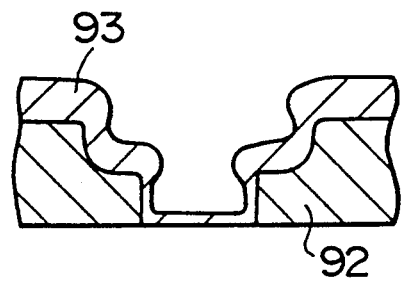
Figure 9C:
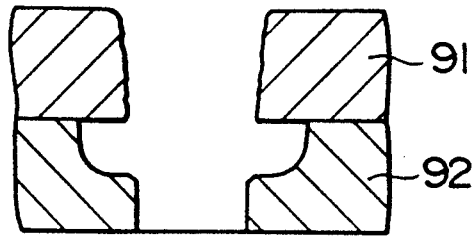

In the anisotropic etching shown in FIG. 9C, it was assumed that an etchant moves vertically downwardly. The etching of the SiO2 substrate 92 was simulated.

④ Removal of Resist

In FIG. 9D, the resist 91 was completely removed by isotropic etching.

⑤ Sputter Deposition

In FIG. 9E, it was assumed that a contact hole was present in the center of a wafer. The surface diffusion of aluminum was incorporated, and the formation of an aluminum layer 93 was simulated.

Figure 10A:
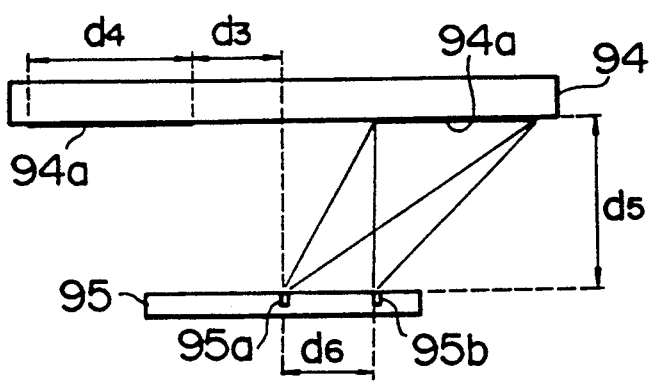
FIG. 10A is a view showing the positional relationship between a target and a wafer used in the simulation of FIG. 9E.

FIG. 10A shows the positional relationship between a target 94 and a wafer 95 used in the simulation of the above-described sputter deposition. The target 94 has a disk shape whose diameter is 300 mm. An erosion area 94a having a width $d_4=90$ mm is formed a distance $d_3=50$ mm away from the center of the disk. The wafer 95 having a diameter of 150 mm is positioned $d_5=85$ mm below the target 94.

Figure 10B:
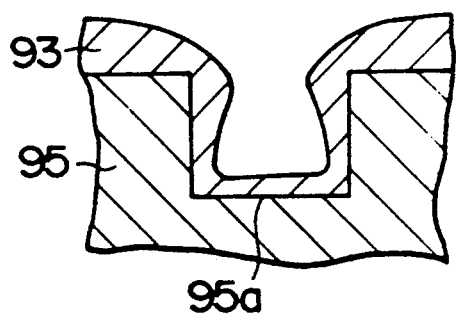
FIGS. 10B and 10C and are views each showing the result of a simulation where an aluminum layer was accumulated in a groove positioned in the center of the wafer of FIG. 10A and in a groove positioned away from the center.
Figure 10C:
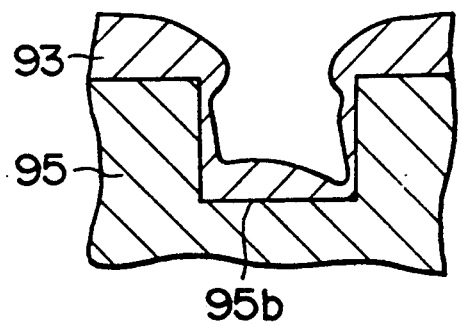
Figure 11A:
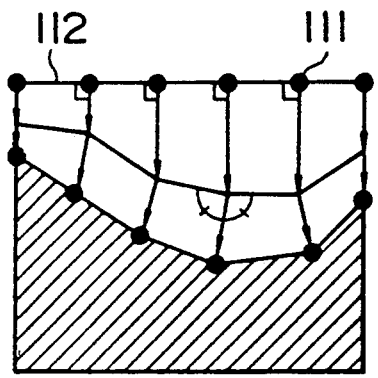
FIGS. 11A to 11C are conceptual views showing conventional shape simulation methods.
Figure 11B:
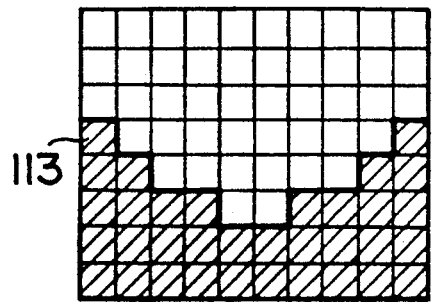
Figure 11C:
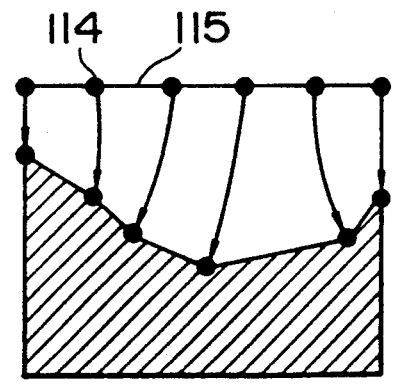
Figure 12A:
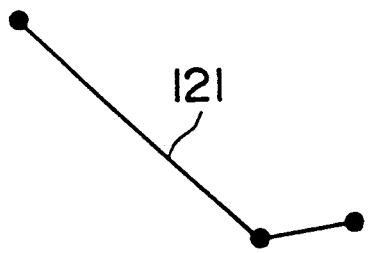
FIGS. 12A to 12F are views showing singular point processing in the string model.
Figure 12D:
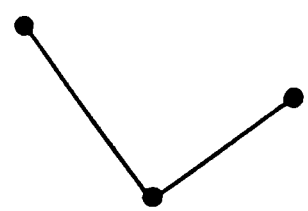
Figure 12B:
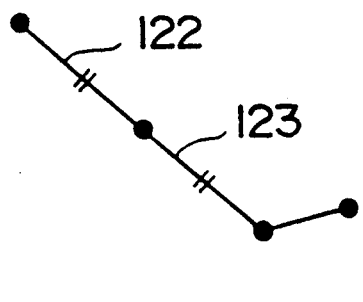
Figure 12E:
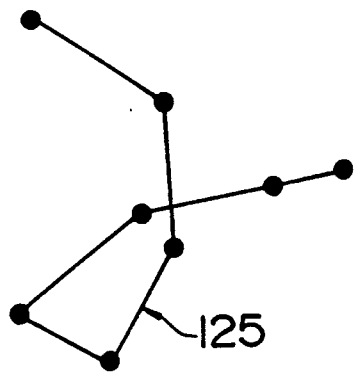
Figure 12C:
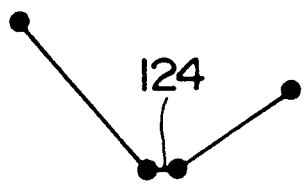
Figure 12F:
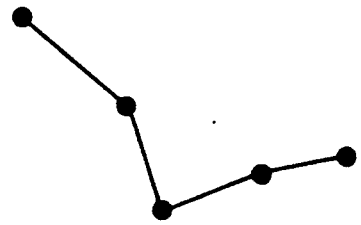
Figure 13A:
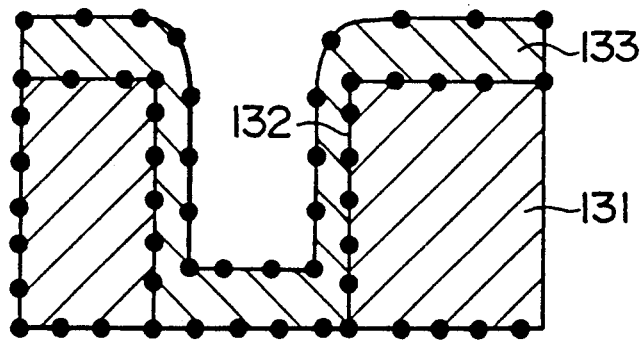
FIGS. 13A to 13C are views showing problems when deposition is simulated using the string model.
Figure 13B:
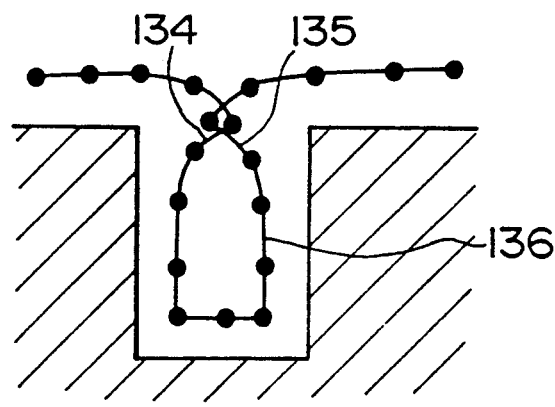
Figure 13C:
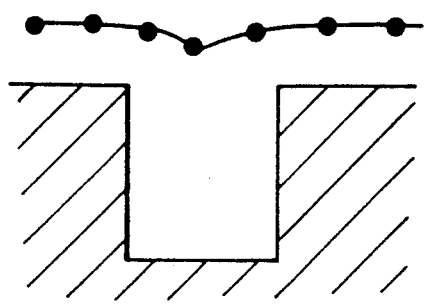

In the above-described simulation of the sputter deposition, it was assumed that the contact hole is positioned in the center of the wafer. The results of the simulation in the cases where the aluminum layer 93 was accumulated in a groove 95a positioned in the center of the wafer 95 and in a groove 95b a distance $d_6=50$ mm away from the center of the wafer 95 shown in FIG. 10A are shown respectively in FIGS. 10B and 10C. Both grooves are 2 μm wide and 2 μm deep. The aluminum layer 93 was symmetrically formed in the groove 95a in the center of the wafer 95 but the aluminum layer 93 was asymmetrically formed in the groove 95b which is spaced from the center of the wafer 95.

In the above-described embodiment, an orthogonal mesh system was used. However, an analysis area may be divided into triangular or polygonal cells.

What is claimed is:

1. A method of describing a surface of an object subjected to processing that changes the shape of the surface comprising:

dividing an analysis volume including an object having a surface and a volume filling part of the analysis volume into a plurality of three-dimensional cells, each cell having a cell volume;

defining an initial volume ratio for each cell, the initial volume ratio for each cell equaling the volume of the object within that cell to the volume of that cell;

computing the rate at which a substance flows into and out of each cell during a process changing the shape of the surface of the object for every time period $\Delta t$ during a treatment period $t_o$, where $t_o$ is much longer than $\Delta t$;

computing a volume ratio for each cell from the initial volume ratio and the rates at which the substance flows into and out of the respective cell for every time period $\Delta t$;

after lapse of the time $t_o$, connecting the cells having a volume ratio with a predetermined value to describe the surface of the object; and graphically displaying the described surface.

2. The method as claimed in claim 1 comprising:

regarding each cell having a volume ratio of at least 0.5 and an adjacent cell having a volume ratio less than 0.5 as a surface cell;

computing a tentative volume ratio in each surface cell after a lapse of each time period $\Delta t$ during a process of adding the substance to the surface of the object; and resetting the volume ratio of each surface cell whose tentative volume exceeds 1 to 1 and distributing the part of the volume ratio exceeding 1 from the tentative volume ratio to the adjacent cells having a volume ratio of no more than 0.5.

3. The method as claimed in claim 1 comprising:

regarding each cell having a volume ratio of at least 0 and an adjacent cell having a volume ratio of 0 as a surface cell;

computing a tentative volume ratio in each surface cell after a lapse of each time period $\Delta t$ during a process of removing a substance from the surface of the object; and resetting the volume ratio of each surface cell whose tentative volume has become negative to 0 and distributing the negative tentative volume ratio to the adjacent cells having a volume ratio of at least 0.5.

4. The method as claimed in claim 1 comprising approximating the volume ratios by interpolation after a volume ratio for each cell is computed.

5. The method as claimed in claim 1 wherein the rates the substance flows into and out of each cell are computed using a solid angle.

6. The method as claimed in claim 5 wherein the cell at the topmost position is determined from the cells having a volume ratio of 1 and wherein cells above a cell at the topmost position are not taken into consideration when the solid angle determination is made.

* * * * *